United States Patent
Nakamoto

(10) Patent No.: US 11,329,743 B2
(45) Date of Patent: May 10, 2022

(54) TRANSMISSION SYSTEM, TRANSMITTING APPARATUS, RECEIVING APPARATUS, AND PROGRAM

(71) Applicant: Asahi Kasei Microdevices Corporation, Tokyo (JP)

(72) Inventor: Seiko Nakamoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 156 days.

(21) Appl. No.: 16/841,600

(22) Filed: Apr. 6, 2020

(65) Prior Publication Data

US 2020/0374020 A1 Nov. 26, 2020

(30) Foreign Application Priority Data

May 23, 2019 (JP) .............................. JP2019-097109
Feb. 28, 2020 (JP) .............................. JP2020-033957

(51) Int. Cl.
*H04J 3/02* (2006.01)
*G06F 3/16* (2006.01)
*H03M 3/00* (2006.01)

(52) U.S. Cl.
CPC ................ *H04J 3/02* (2013.01); *G06F 3/165* (2013.01); *H03M 3/30* (2013.01)

(58) Field of Classification Search
CPC .............. H04J 3/02; G06F 3/165; H03M 3/30
USPC ....................................................... 370/498
See application file for complete search history.

(56) References Cited

U.S. PATENT DOCUMENTS

| 5,793,318 A | 8/1998 | Jewett | |
|---|---|---|---|
| 2008/0037779 A1 | 2/2008 | Seman | |
| 2010/0217789 A1 | 8/2010 | Saitoh | |
| 2010/0296602 A1* | 11/2010 | Inui | H03M 3/332 |
| | | | 375/295 |
| 2016/0105107 A1* | 4/2016 | Chang | H02M 3/158 |
| | | | 323/271 |
| 2016/0211861 A1* | 7/2016 | Op 't Eynde | H03M 1/109 |
| 2019/0199368 A1* | 6/2019 | Weng | H03M 3/454 |

FOREIGN PATENT DOCUMENTS

| JP | H03232344 A | 10/1991 |
|---|---|---|
| JP | H10145232 A | 5/1998 |
| JP | H10233687 A | 9/1998 |
| JP | 2000022593 A | 1/2000 |
| JP | 2014230168 A | 12/2014 |

\* cited by examiner

*Primary Examiner* — Faisal Choudhury

(57) ABSTRACT

In a transmission system of an audio signal etc., circuit enlargement is suppressed and deterioration of transmitting signal is reduced. A transmission system including a transmitting apparatus including a first delta-sigma modulator outputting first multi-bit delta-sigma modulated signals of three or more bits and a first code modulator code-modulating first signals of two or more bits located in bit positions higher than a predetermined bit position of the first multi-bit delta-sigma modulated signals based on at least part of a second signal located in one or more bit positions not higher than the predetermined bit position and outputting a plurality of modulated signals; a transmission path transmitting the second signal and the plurality of modulated signals; and a receiving apparatus including a first demodulator demodulating the plurality of the received modulated signals based on at least part of the received second signal is provided.

20 Claims, 15 Drawing Sheets

TRANSMISSION SYSTEM, TRANSMITTING APPARATUS, RECEIVING APPARATUS, AND PROGRAM

The contents of the following Japanese patent applications are incorporated herein by reference:
No. 2019-097109 filed in JP on May 23, 2019, and
No. 2020-033957 filed in JP on Feb. 28, 2020.

BACKGROUND

1. Technical Field

The disclosure relates to a transmission system, a transmitting apparatus, a receiving apparatus, and a program.

2. Related Art

There is a system that transmits digital signals of a plurality of bits obtained by delta-sigma modulation in order to transmit an analog signal with high precision (for example, see Patent Document 1).

[Patent Document 1] Japanese Patent Application Publication 2010-273307

In the system that transmits a signal obtained by multi-bit delta-sigma modulating an audio signal etc., because noise components have characteristics that depend on the transmitted signal, the deterioration of an analog signal to be reproduced is caused when this noise is superimposed on an analog section, a sampling clock, etc. via a ground of the system. On the contrary, when transmitting a plurality of signals, Patent Document 1 discloses a method of reducing audio components superimposed on the signals by spreading the signals to be transmitted with pseudo-random signals and transmitting them.

However, because the system simultaneously transmits not only signals obtained by modulating the analog signals but also the pseudo-random signals in order to perform demodulation at the receiving side, it is necessary to provide extra output terminals, etc. and thus a circuit area increases.

SUMMARY

To solve the above problems, according to the first aspect of the present disclosure, there is provided a transmission system that includes: a transmitting apparatus including a first delta-sigma modulator that outputs first multi-bit delta-sigma modulated signals of three or more bits and a first code modulator that code-modulates first signals of two or more bits located in bit positions higher than a predetermined bit position of the first multi-bit delta-sigma modulated signals based on at least part of a second signal located in one or more bit positions not higher than the predetermined bit position and outputs a plurality of modulated signals; a transmission path that transmits the second signal and the plurality of modulated signals; and a receiving apparatus including a first demodulator that demodulates the plurality of modulated signals received from the transmission path based on at least part of the second signal received from the transmission path.

According to the second aspect of the present disclosure, there is provided a transmitting apparatus that includes: a first delta-sigma modulator that outputs first multi-bit delta-sigma modulated signals of three or more bits; and a first code modulator that code-modulates first signals of two or more bits located in bit positions higher than a predetermined bit position of the first multi-bit delta-sigma modulated signals based on at least part of a second signal located in one or more bit positions not higher than the predetermined bit position and outputs a plurality of modulated signals, wherein the transmitting apparatus transmits the second signal and the plurality of modulated signals to a transmission path.

According to the third aspect of the present disclosure, there is provided a receiving apparatus receiving first multi-bit delta-sigma modulated signals of three or more bits, the receiving apparatus including: a first demodulator that demodulates a plurality of code-modulated signals of two or more bits located in bit positions higher than a predetermined bit position of the first multi-bit delta-sigma modulated signals based on at least part of a second signal located in one or more bit positions not higher than the predetermined bit position of the received first multi-bit delta-sigma modulated signals.

According to the fourth aspect of the present disclosure, there is provided a program to make a computer function as the transmitting apparatus of the second aspect or the receiving apparatus of the third aspect.

The summary clause does not necessarily describe all necessary features of the embodiments of the present invention. The present invention may also be a sub-combination of the features described above.

DESCRIPTION OF EXEMPLARY EMBODIMENTS

Hereinafter, although the present disclosure will be described using some embodiments of the disclosure, the embodiments below do not limit the invention according to the claims. Moreover, all of combinations of features described in the embodiments are not necessarily essential to means provided by aspects of the inventions.

Figure 1:
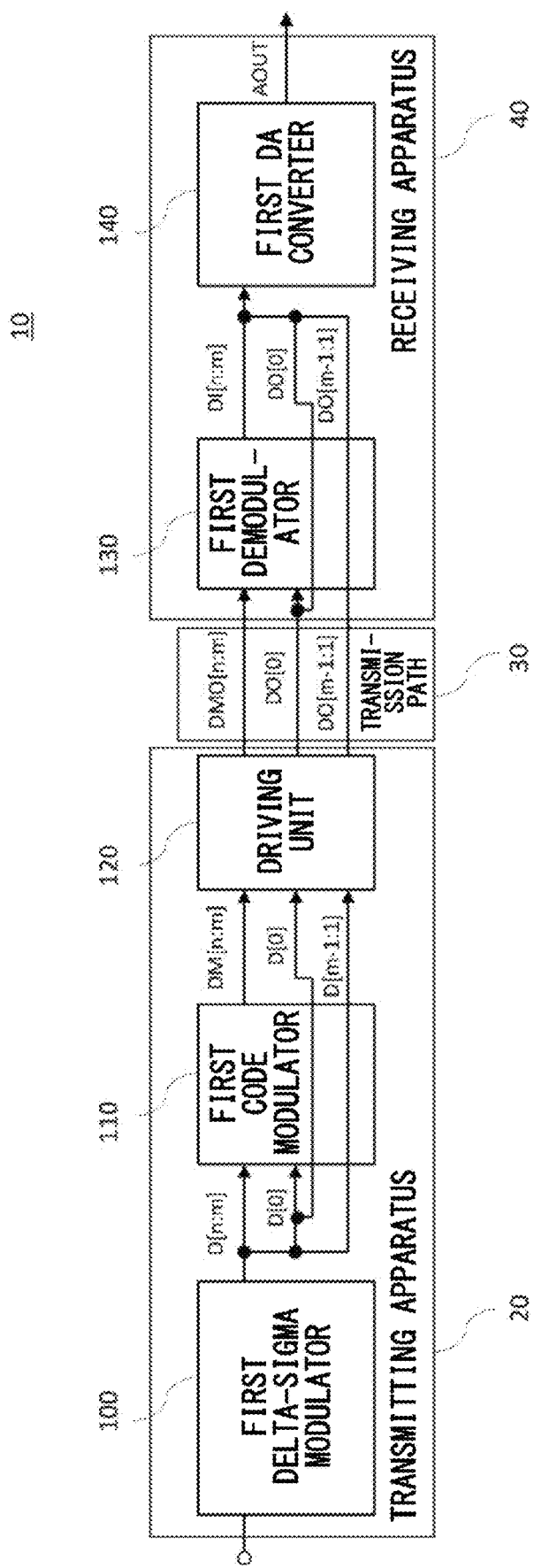
FIG. 1 illustrates a first configuration example of a transmission system 10 according to the present embodiment.

FIG. 1 illustrates a first configuration example of a transmission system 10 according to the present embodiment. The transmission system 10 modulates an input signal such as an audio signal to transmit the modulated digital signal, demodulates the digital signal received at the receiving side to convert the digital signal to an analog signal, and outputs the converted analog signal. The transmission system 10 includes a transmitting apparatus 20, a transmission path 30, and a receiving apparatus 40.

The transmitting apparatus 20 is connected to the transmission path 30. The transmitting apparatus 20 performs multi-bit delta-sigma modulation and code modulation to the input signal and outputs the modulated signal to the transmission path 30. Here, the input signal may be an analog signal or a digital signal. The transmitting apparatus 20 includes a first delta-sigma modulator 100, a first code modulator 110, and a driving unit 120.

The first delta-sigma modulator 100 is connected to the first code modulator 110. The first delta-sigma modulator 100 delta-sigma modulates an input signal input into an input terminal and outputs first multi-bit delta-sigma modulated signals D[n:0] which are digital signals of n+1 bits (n>0, for example, n≥2). Moreover, the first delta-sigma modulator 100 may be directly connected to the driving unit 120 and may directly transmit first multi-bit delta-sigma modulated signals D[m−1:1] that are not used for code modulation to the driving unit 120. Here, [n:0] indicates signals from the least significant bit 0 to the most significant bit n and [m−1:1] indicates a signal from the higher-order bit m−1 to the lower-order bit 1. The same applies hereinafter.

The first code modulator 110 is connected to the driving unit 120. The first code modulator 110 receives the high-order bit signals D[n:m] (first signals) and the low-order bit signal D[0] (second signal) of the first multi-bit delta-sigma modulated signals from the first delta-sigma modulator 100. Based on the low-order bit signal D[0] of the first multi-bit delta-sigma modulated signal, the first code modulator 110 code-modulates the high-order bit signals D[n:m] of the first multi-bit delta-sigma modulated signals and outputs code-modulated first multi-bit delta-sigma modulated signals DM[n:m]. The first code modulator 110 may perform code modulation by performing an exclusive OR operation between each of the high-order bit signals D[n:m] and the low-order bit signal D[0]. Here, [n:m] indicates signals of bits from the bit m to the most significant bit n (n≥m>0, for example n>m≥1) and [0] indicates a signal of the least significant bit 0. The same applies hereinafter.

The driving unit 120 is connected to the transmission path 30. The driving unit 120 drives the transmission path 30 to transmit code-modulated first multi-bit delta-sigma modulated signals DMO[n:m] from the first code modulator 110 via the transmission path 30. The driving unit 120 may also output first multi-bit delta-sigma modulated signals of other bits that are not code-modulated DO[m−1:1] and DO[0] to the transmission path 30. The driving unit 120 may output the input signal as it is.

The transmission path 30 is connected in between the transmitting apparatus 20 and the receiving apparatus 40, and is, for example, a wiring, cables, etc., transmitting electrical signals. The transmission path 30 transmits the low-order bit signal DO[0] and the intermediate bit signal DO[m−1:1] of the first multi-bit delta-sigma modulated signals and the code-modulated high-order bit signals DMO[n:m] of the first multi-bit delta-sigma modulated signals from the transmitting apparatus 20 to the receiving apparatus 40. The transmission path 30 may include a plurality of the transmission paths 30 corresponding to a plurality of respective signals of bits or may be one transmission path 30 transmitting the plurality of signals of bits.

The receiving apparatus 40 receives the first multi-bit delta-sigma modulated signals via the transmission path 30, demodulates the signal, and outputs an analog signal. The receiving apparatus 40 includes a first demodulator 130 and a first digital-to-analog converter 140.

The first demodulator 130 is connected to the transmission path 30 and the first digital-to-analog converter 140. The first demodulator 130 receives, via the transmission path 30, the high-order bit signals DMO[n:m] and the low-order bit signal DO[0] of the first multi-bit delta-sigma modulated signals. Based on the low-order bit signal DO[0] of the first multi-bit delta-sigma modulated signals transmitted via the transmission path 30, the first demodulator 130 demodulates the code-modulated high-order bit signals DMO[n:m] of the first multi-bit delta-sigma modulated signals transmitted via the transmission path 30. The first demodulator 130 may perform demodulation by an exclusive OR operation between each of the high-order bit signals DMO[n:m] and the low-order bit signal DO[0]. The first demodulator 130 outputs a demodulated first multi-bit delta-sigma modulated signals DI[n:m].

The first digital-to-analog converter 140 converts the digital signals of the demodulated high-order bit signals DI[n:m] of the first multi-bit delta-sigma modulated signals and the lower-order bit signal DO[m−1:0] of the first multi-bit delta-sigma modulated signals into analog signal and outputs the analog signal AOUT. The first digital-to-analog converter 140 may be directly connected to the transmission path 30 to directly receive the intermediate bit signal DO[m−1:1] of the first multi-bit delta-sigma modulated signals that is not used for demodulation via the transmission path 30.

Because the transmission system 10 of the present embodiment transmits the first multi-bit delta-sigma modulated signals to be transmitted by performing the code modulation only to the high-order bit signals and not to the low-order bit signal of the first multi-bit delta-sigma modulated signals, addition of a signal for code modulation is unnecessary. Therefore, the transmission system 10 of the present embodiment can reduce noise when transmitting a signal and thus is able to transmit a high-quality multi-bit audio signal without providing an additional output terminal. Moreover, because the transmission system 10 of the present embodiment code-modulates only the high-order bit signals that are a part of the first multi-bit delta-sigma modulated signals and transmits the modulated signals and the other bit signal without performing code modulation, increase in the circuit area for code modulation can be suppressed.

Figure 2:
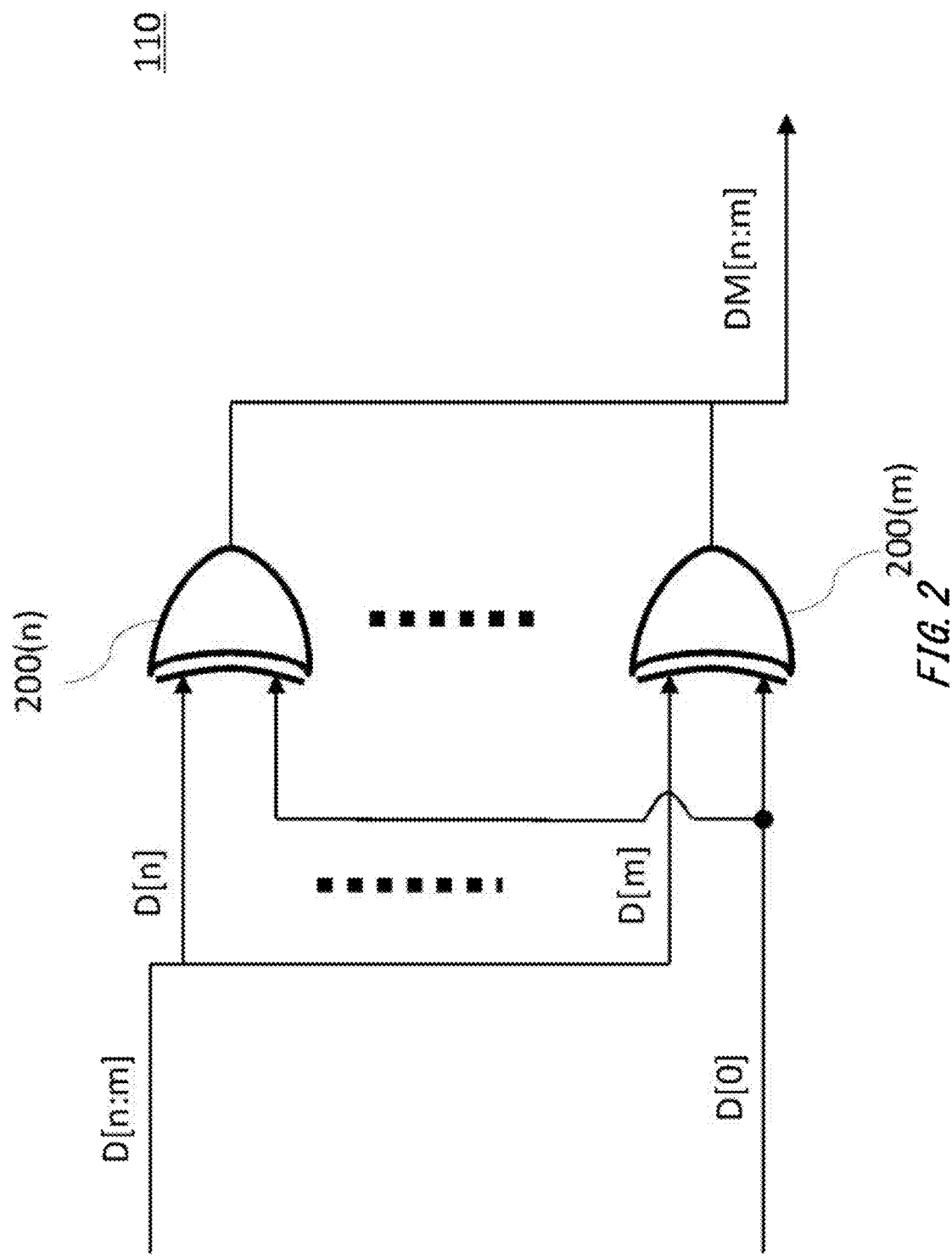
FIG. 2 illustrates a configuration of a first code modulator 110 of the present embodiment.

FIG. 2 illustrates a configuration of the first code modulator 110 of the present embodiment. The first code modulator 110 includes one or more (n−m+1 pieces of) exclusive OR elements 200(*m*) to 200(*n*) that correspond to the respective bits (from bit n to bit m) of high-order bit signals (signal of n−m+1 bits) of the first multi-bit delta-sigma modulated signals to be code-modulated. It should be noted that in FIG. 2 illustrating the first code modulator 110, a part of the exclusive OR elements 200(*m*+1) to 200(*n*−1) and the wiring connected thereto are omitted.

The plurality of exclusive OR elements 200(*m*) to 200(*n*) are connected in parallel. Each of the high-order bit signals D[n:m] is input as one input in the respective exclusive OR elements and the least significant bit signal D[0] is input into the exclusive OR elements as the other input. The plurality of exclusive OR elements 200(m) to 200(n) perform respective exclusive OR operations between the input signals to perform code modulation and output the signal DM[n:m] indicating the operation results.

Figure 3:
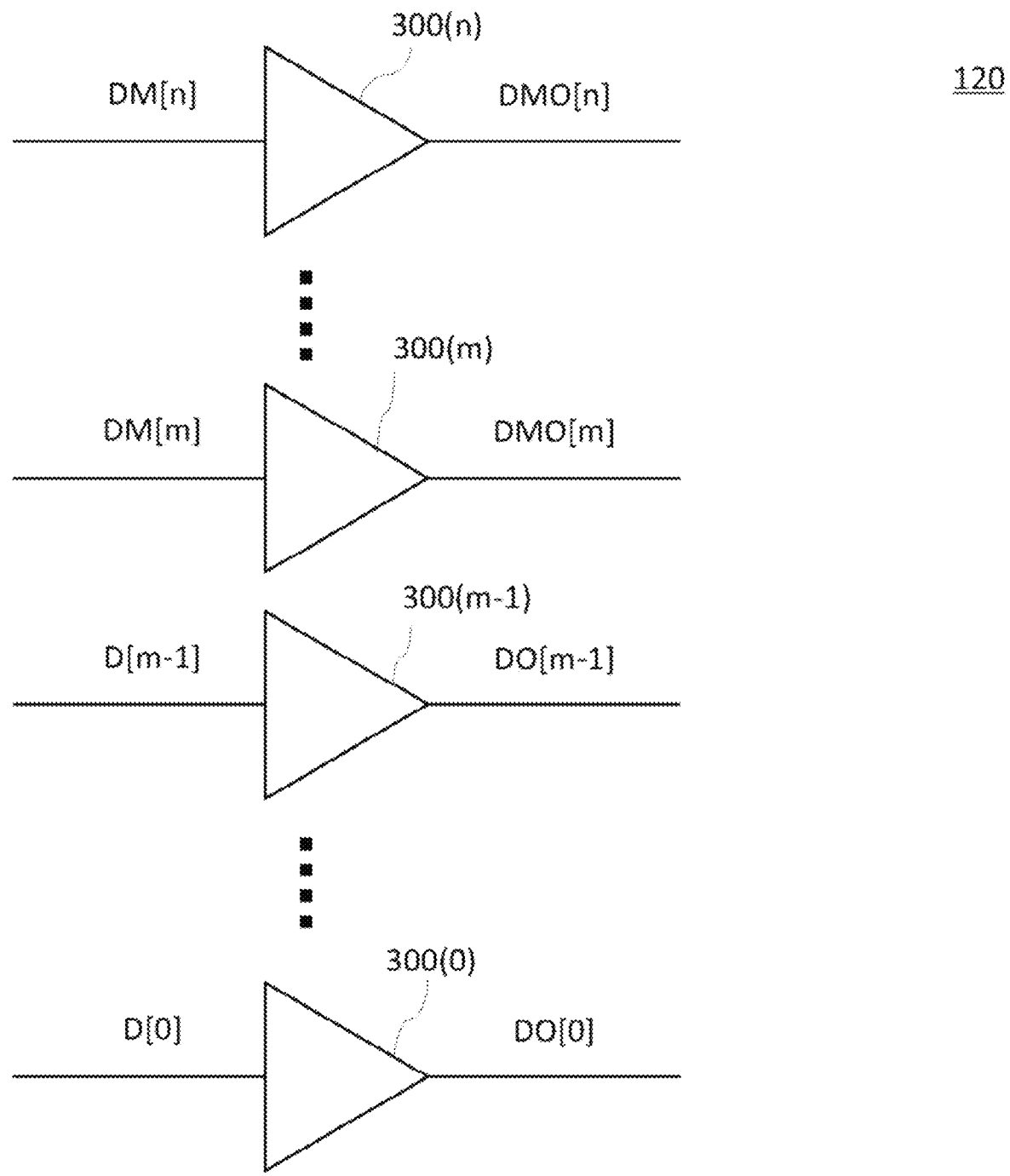
FIG. 3 illustrates a configuration of a driving unit 120 of the present embodiment.

FIG. 3 illustrates a configuration of the driving unit 120 of the present embodiment. The driving unit 120 includes a plurality of buffers 300(0) to 300(n) that correspond to the respective signals DM[n:m] and signal D[m−1:0] to be transmitted via the transmission path 30. The plurality of buffers 300 are connected in parallel. The first multi-bit delta-sigma modulated signals DM[n:m] and D[m−1:0] are input into the respective buffers and the first multi-bit delta-sigma modulated signals DMO[n:m] and DO[m−1:0] are output to the transmission path 30. It should be noted that in FIG. 3 illustrating the driving unit 120, a part of the buffers 300 and the wiring connected thereto are omitted.

Figure 4:
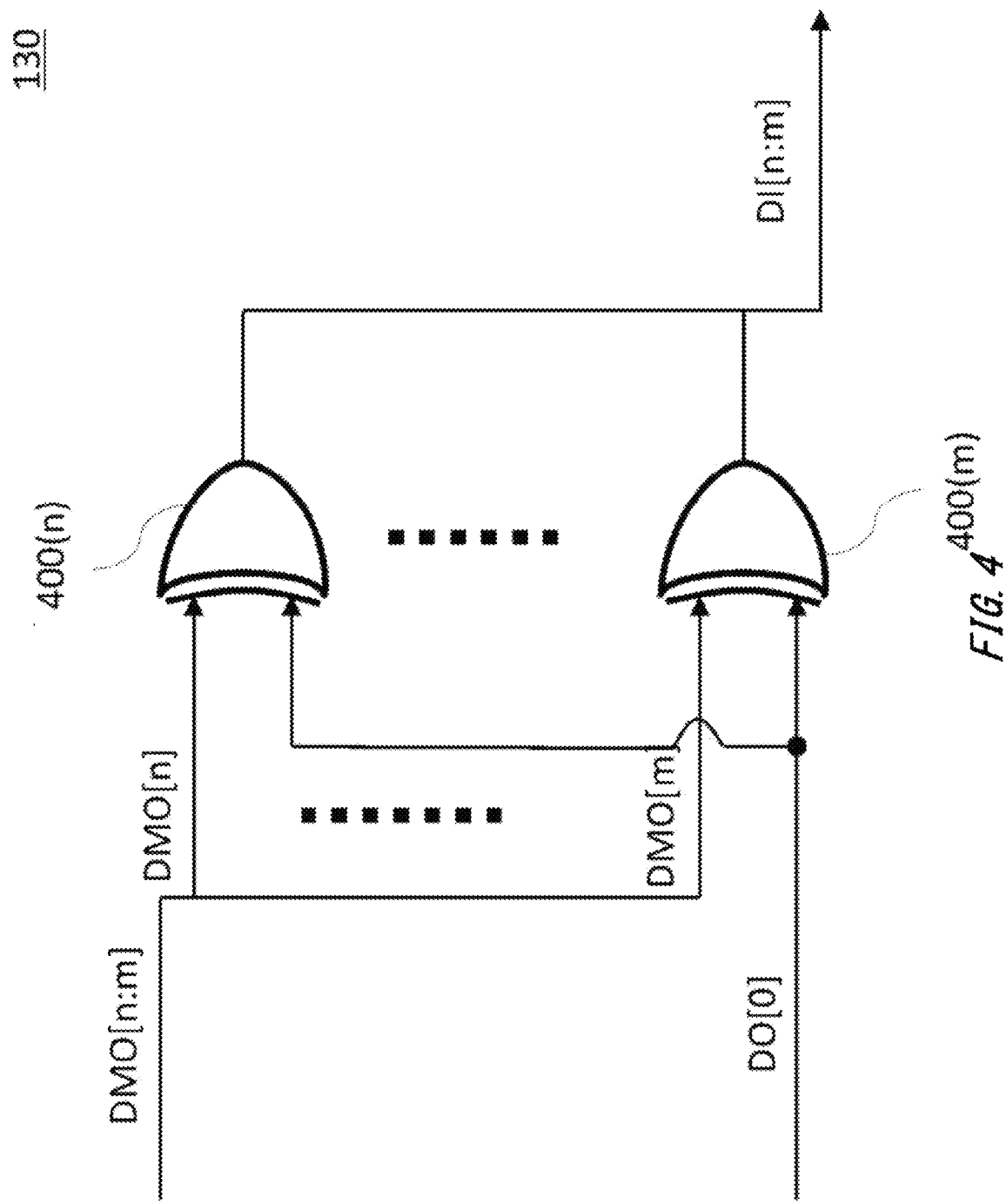
FIG. 4 illustrates a configuration of a first demodulator 130 of the present embodiment.

FIG. 4 illustrates a configuration of the first demodulator 130 of the present embodiment. The first demodulator 130 includes one or more (n−m+1 pieces of) exclusive OR elements 400(m) to 400(n) that correspond to the respective bits (from bit n to bit m) of the code-modulated high-order bit signals (signal of n−m+1 bits) of the first multi-bit delta-sigma modulated signals. It should be noted that in FIG. 4 illustrating the first demodulator 130, a part of the exclusive OR elements 400(m+1) to 400(n−1) and the wiring connected thereto are omitted.

The plurality of exclusive OR elements 400(m) to 400(n) are connected in parallel. Each of the high-order bit signals DMO[n:m] is input as one input in the respective exclusive OR elements and the least significant bit signal DO[0] is input into the exclusive OR elements as the other input. The plurality of exclusive OR elements 400(m) to 400(n) perform respective exclusive OR operations between the input signals to perform demodulation and output the high-order bit signals DI[n:m] indicating the operation results.

Figure 5:
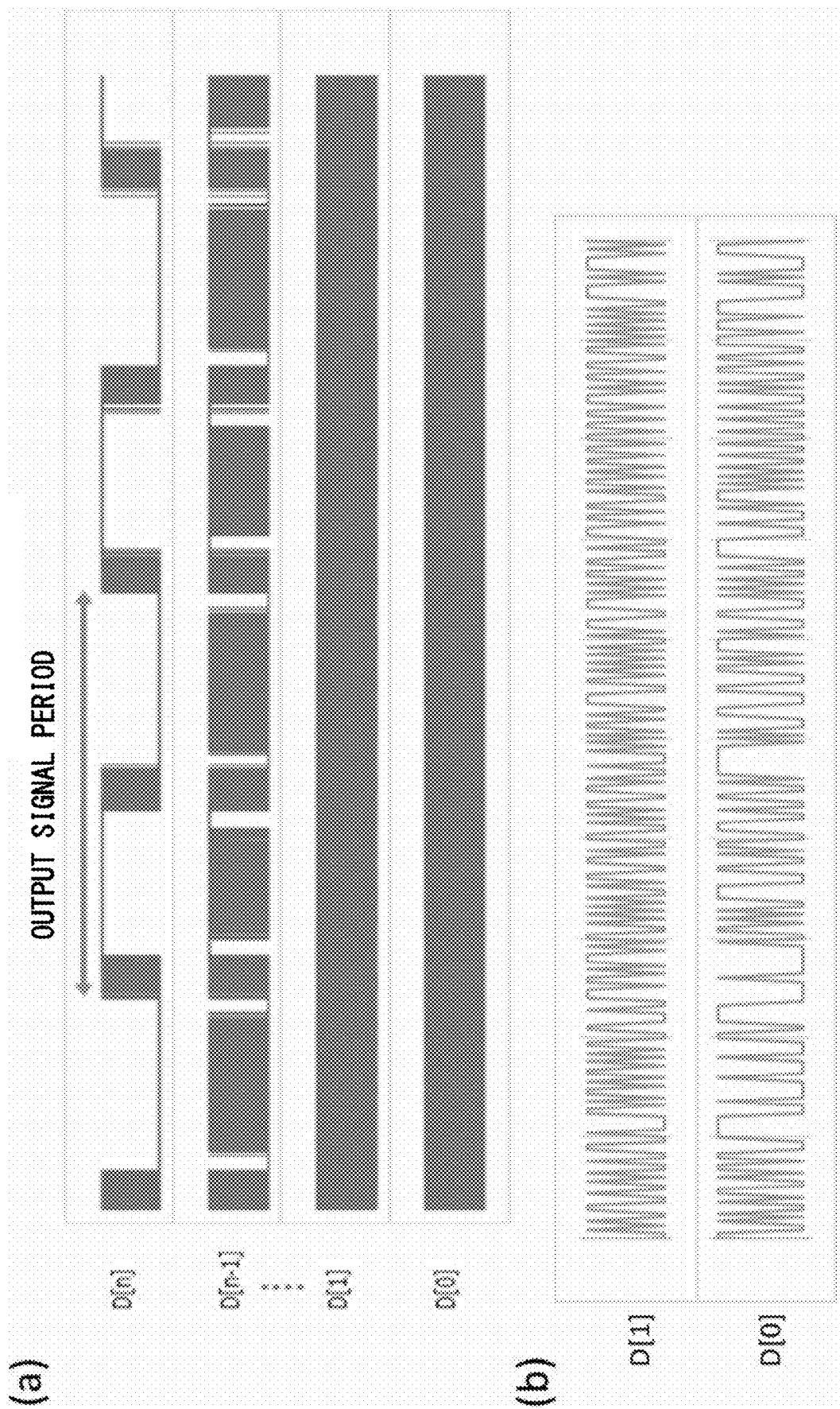
FIG. 5 illustrates waveforms of an output signal D of a first delta-sigma modulator 100.

FIG. 5(a) illustrates the waveforms of the output signals D[n:0] of the first delta-sigma modulator 100. FIG. 5(b) illustrates the expanded waveforms of the output signals D[1:0] of the first delta-sigma modulator 100. In FIG. 5(a) and FIG. 5(b), the vertical axis indicates a value of 0 or 1 of the output signals and the horizontal axis indicates time.

As illustrated in FIG. 5(a), the first delta-sigma modulator 100 outputs the respective delta-sigma modulated signals D of n+1 bits. The signals D show higher correlation with the output signal as the bit of the signal is of a high-order and shows lower correlation with the output signal as the bit of the signal is of a low-order bit and randomness increases. As illustrated in FIG. 5(b), the least significant bit 0 has the highest randomness. Therefore, the first code modulator 110 of the present embodiment uses a low-order bit having the lower correlation with the output signal to code-modulate a high-order bit.

Figure 6:
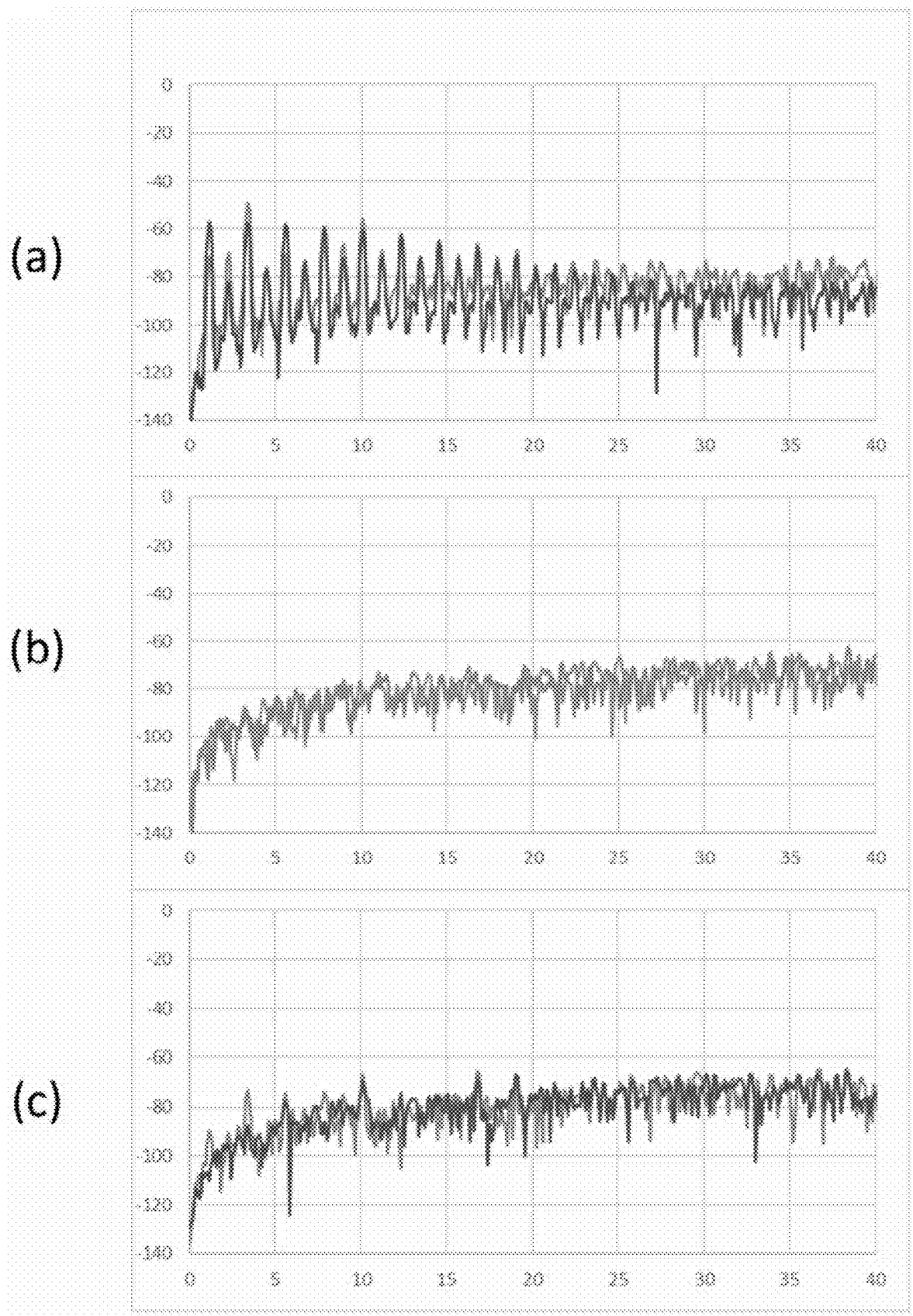
FIG. 6 illustrates spectra of noise components of first multi-bit delta-sigma modulated signals.

FIG. 6(a) illustrates a spectrum of a noise component caused by the output of the high-order bit signals D[n:n−1] that are not code-modulated. FIG. 6(b) illustrates a spectrum of a noise component caused by the output of the low-order bit signals D[1:0] that are not code-modulated. FIG. 6(c) illustrates a spectrum of a noise component caused by the output of the high-order bit signals D[n:n−1] that are code-modulated by the first code modulator 110 of the present embodiment.

As illustrated in FIG. 6(a), a signal frequency component appears strongly in the noise because the high-order bit is strongly affected by the code. Because the low-order bit is randomized by containing more high frequency noise components, the low-order bit does not have a unique frequency component and has small noise as illustrated in FIG. 6(b). Like the high-order bit, when noise having characteristics depending on the output signal is transmitted and is mixed into the analog signal, deterioration of the output signal is caused. As illustrated in FIG. 6(c), when code modulation is performed by the first code modulator 110 of the present embodiment, the noise of the high-order bit signals that occurs during transmitting the signal may be reduced.

Figure 7:
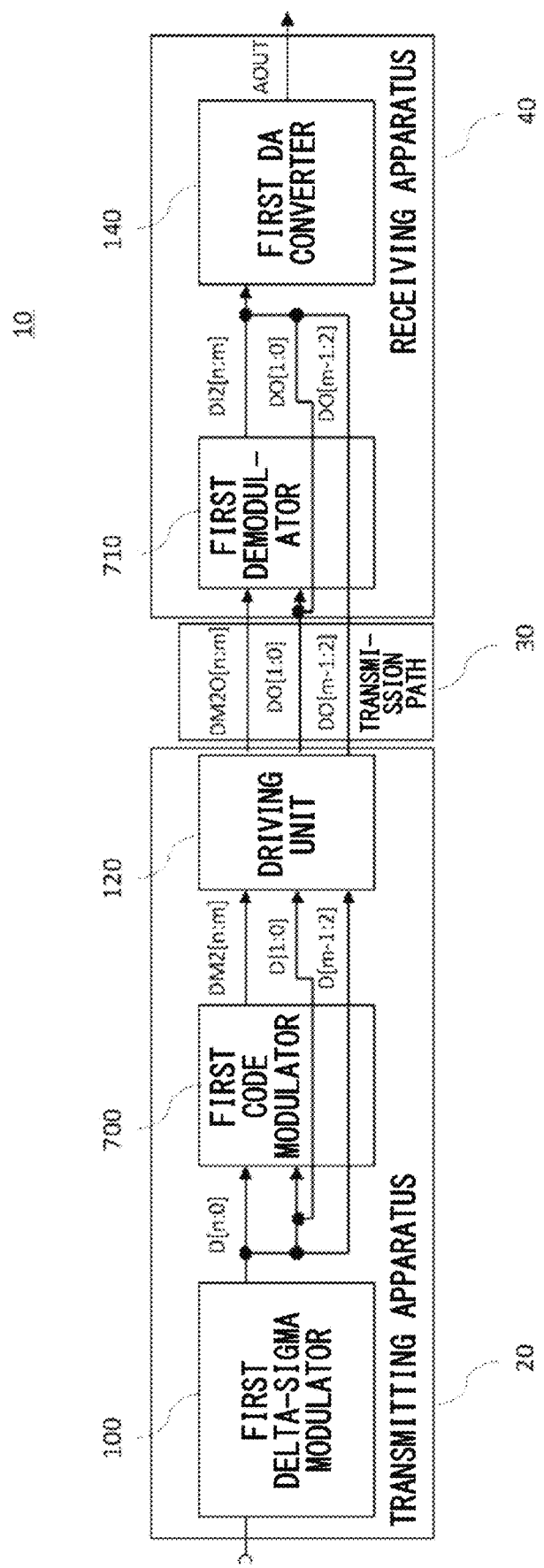
FIG. 7 illustrates a second configuration example of the transmission system 10 of the present embodiment.

FIG. 7 illustrates a second configuration example of the transmission system 10 of the present embodiment. Each configuration of the transmission system 10 according to the second configuration example may be similar to each configuration of the transmission system 10 according to the first configuration example. However, the transmission system 10 according to the second configuration example performs multiple stages of code modulation based on a plurality of low-order bit signals D[1:0]. Hereinafter, description of the configuration similar to the transmission system 10 according to the first configuration example is omitted.

A first code modulator 700 receives the high-order bit signals D[n:m] and the low-order bit signals D[1:0] of the first multi-bit delta-sigma modulated signals from the first delta-sigma modulator 100. For example, the first code modulator 700 performs a two-stage exclusive OR operation between each of the high-order bit signals D[n:m] of the first multi-bit delta-sigma modulated signals and the two different low-order bit signals D[1:0] to perform code modulation. The first code modulator 700 performs an exclusive OR operation between each of the high-order bit signals D[n:m] and low-order bit signal D[0], and further performs an exclusive OR operation between each of the operation results of exclusive OR corresponding to the high-order bit signals D[n:m] and the low-order bit signal D[1]. The first code modulator 700 according to the second configuration example performs code modulation by performing the two-stage exclusive OR operation and outputs a code-modulated high-order bit signals DM2[n:m] of the first multi-bit delta-sigma modulated signals.

A first demodulator 710 receives high-order bit signals DM2O[n:m] and low-order bit signals DO[1:0] of the first multi-bit delta-sigma modulated signals from the transmission path 30. The first demodulator 710 demodulates the high-order bit signals DM2O[n:m] using the low-order bit signals DO[1:0] in the reverse order to code modulation. For example, the first demodulator 710 performs an exclusive OR operation between each of the high-order bit signals DM2O[n:m] and the low-order bit signal DO[1] and further performs an exclusive OR operation between each of the operation results of exclusive OR corresponding to the high-order bit signals DM2O[n:m] and the low-order bit signal DO[0]. The first demodulator 710 according to the second configuration example performs demodulation by performing the two-stage exclusive OR operation and outputs a demodulated high-order bit signals DI2[n:m] of the first multi-bit delta-sigma modulated signals.

Figure 8:
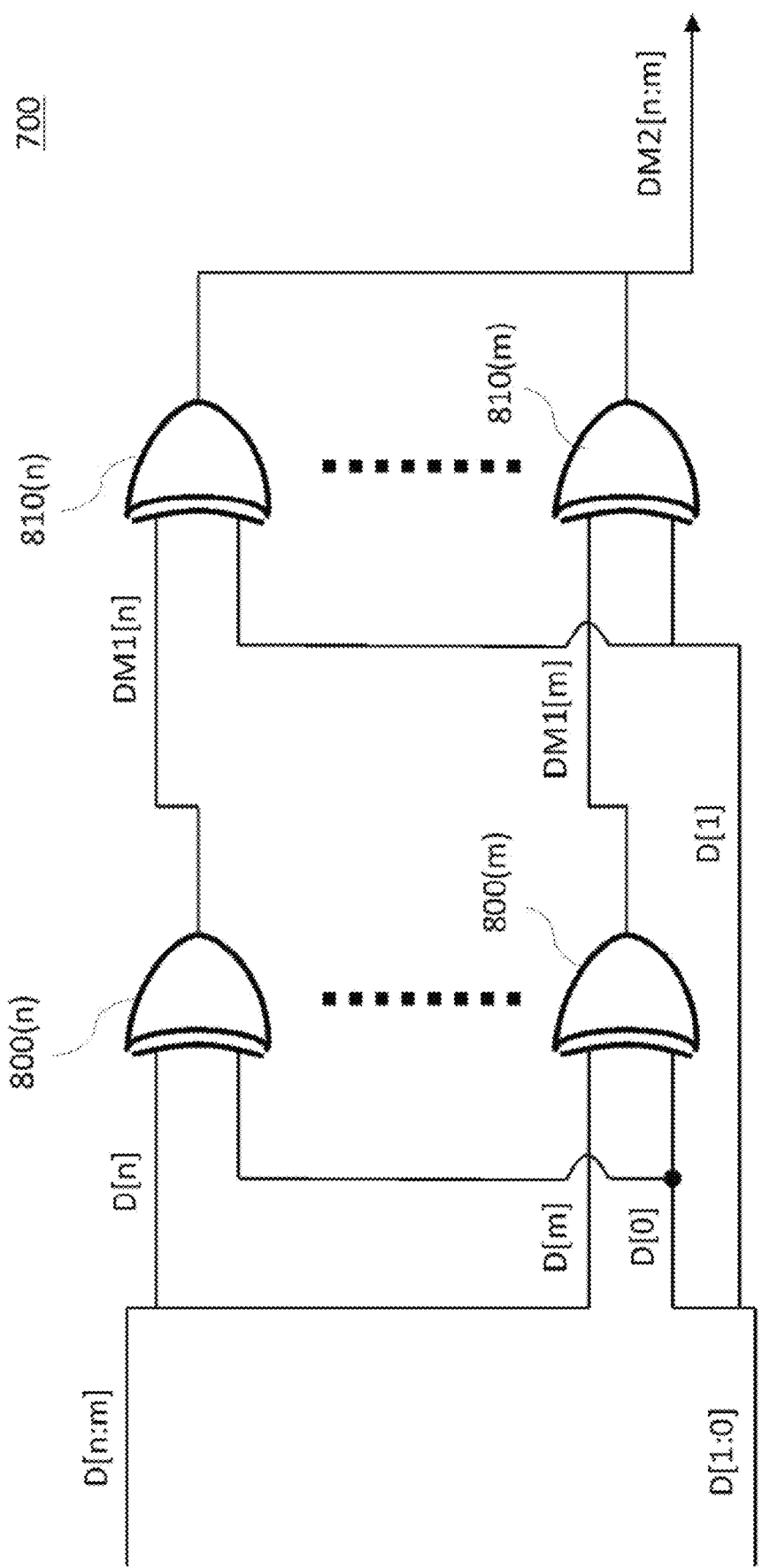
FIG. 8 illustrates a configuration of a first code modulator 700 according to the second configuration example.

FIG. 8 illustrates a configuration of the first code modulator 700 according to the second configuration example. The first code modulator 700 includes two stages of exclusive OR elements 800 and 810 that correspond to the respective high-order bit signals D[n:m] of the first multi-bit delta-sigma modulated signals to be code-modulated. It should be noted that in FIG. 8 illustrating the first code modulator 700, a part of the exclusive OR elements 800(n−1) to 800(m+1) and exclusive OR elements 810(n−1) to 810(m+1) and the wiring connected thereto are omitted. The omitted exclusive OR elements 800(n−1) to 800(m+1) and the omitted exclusive OR elements 810(*n*−1) to 810(*m*+1) have similar configuration and function to those of the exclusive OR elements 800 and 810 illustrated in FIG. 8.

In the first code modulator 700 according to the second configuration example, the exclusive OR elements 800 and 810 corresponding to the same bit of the high-order bit signals D[n:m] are connected serially, and the exclusive OR elements 800 or 810 corresponding to the different bits of the high-order bit signals D[n:m] are connected in parallel.

Each of the high-order bit signals D[n:m] from the first delta-sigma modulator 100 is input as one input and the least significant bit signal D[0] is input as the other input in each of the first-stage exclusive OR elements 800. Each of the output DM1[*n:m*] from the respective exclusive OR elements 800 is input as one input and the low-order bit signal D[1] is input as the other input in each of the second-stage exclusive OR elements 810. Each of the exclusive OR elements 800 and 810 performs an exclusive OR operation on each of the two inputs. The second-stage exclusive OR element 810 outputs the code-modulated high-order bit signals DM2[*n:m*] as the operation result.

Figure 9:
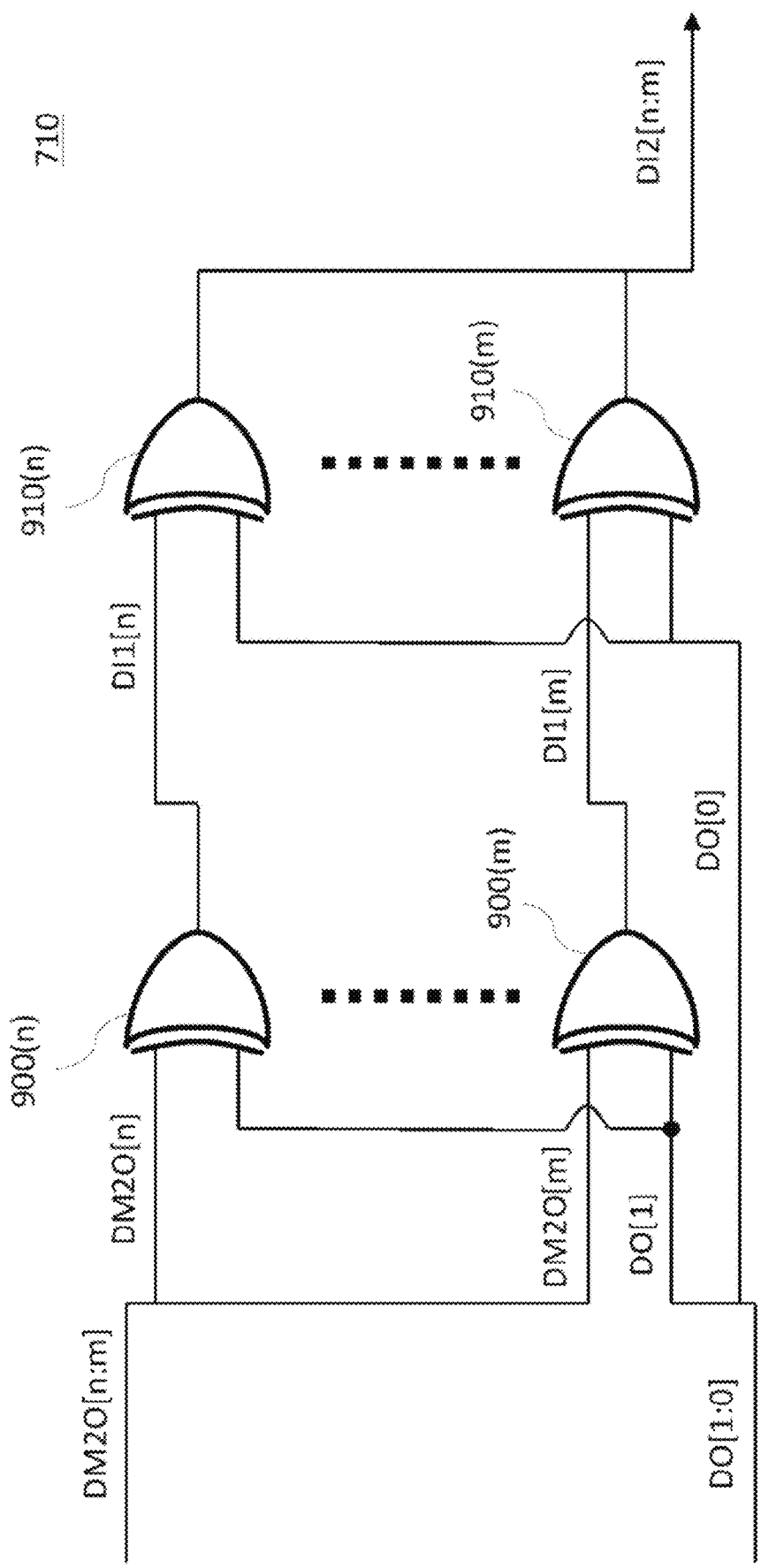
FIG. 9 illustrates a configuration of a first demodulator 710 according to the second configuration example.

FIG. 9 illustrates a configuration of the first demodulator 710 according to the second configuration example. The first demodulator 710 includes two-stage exclusive OR elements 900 and 910 that correspond to the respective high-order bit signals DM2O[n:m] of the first multi-bit delta-sigma modulated signals to be demodulated. It should be noted that in FIG. 9 illustrating the first demodulator 710, a part of the exclusive OR elements 900(*n*−1) to 900(*m*+1) and exclusive OR elements 910(*n*−1) to 910(*m*+1) of the exclusive OR elements and the wiring connected thereto are omitted. The omitted exclusive OR elements 900(*n*−1) to 900(*m*+1) and the omitted exclusive OR elements 910(*n*−1) to 910(*m*+1) have similar configuration and function to those of the exclusive OR elements 900 and 910 illustrated in FIG. 9.

Each of the high-order bit signals DM2O[n:m] from the transmission path 30 is input as one input and the low-order bit signal DO[1] is input as the other input in each of the first-stage exclusive OR elements 900. Each of the outputs DI1[*n:m*] from the respective exclusive OR elements 900 is input as one input and the least significant bit signal DO[0] is input as the other input in each of the second-stage exclusive OR elements 910. Each of the exclusive OR elements 900 and 910 performs an exclusive OR operation on each of the two inputs. The second-stage exclusive OR elements 910 output the demodulated high-order bit signals DI2[*n:m*] as an operation result.

Because two-stage code modulation is performed by using the two of the low-order bit signals, the transmission system 10 according to the second configuration example can more effectively perform code modulation and thus can further reduce noise during transmission.

Figure 10:
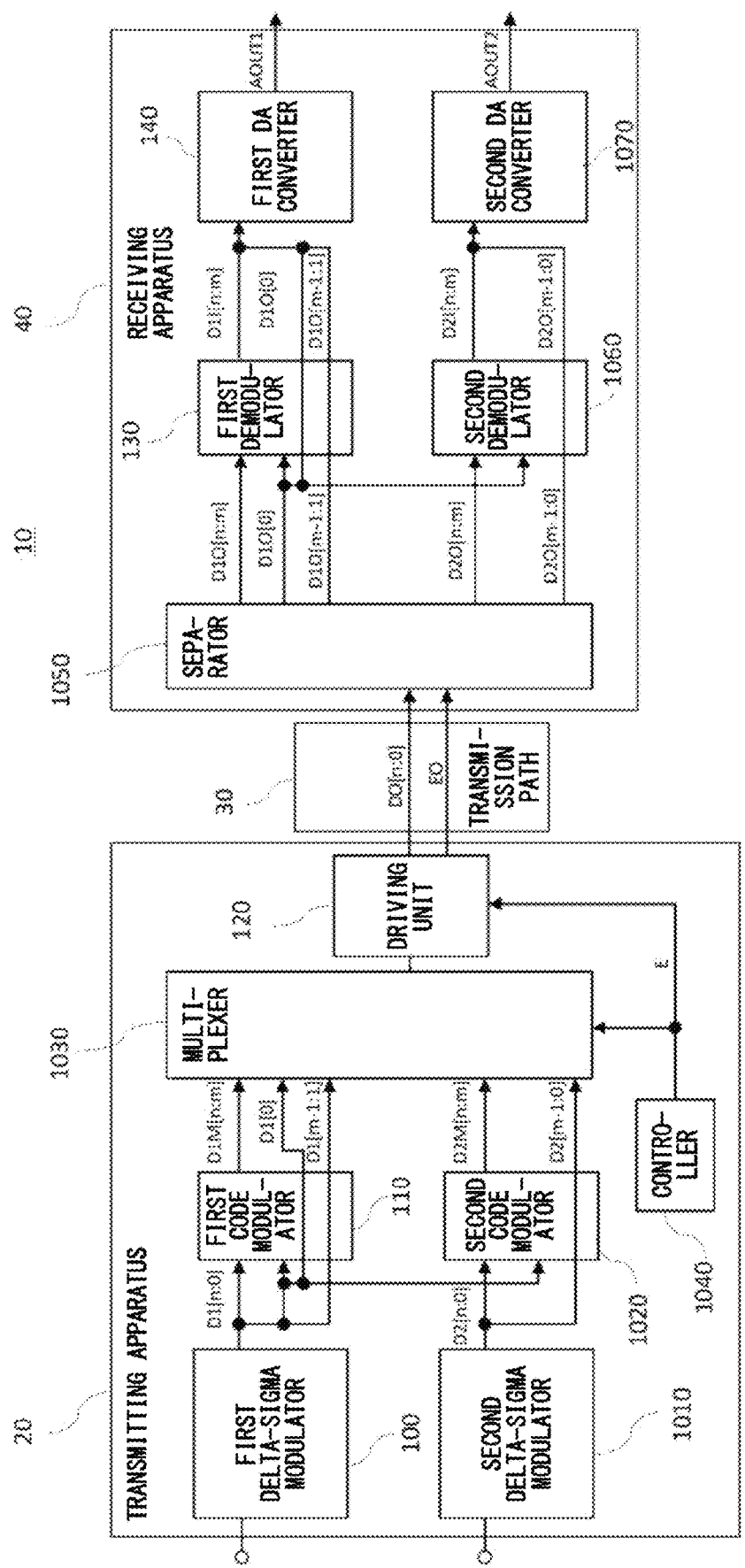
FIG. 10 illustrates a third configuration example of the transmission system 10 of the present embodiment.

FIG. 10 illustrates a third configuration example of the transmission system 10 of the present embodiment. Each configuration of the transmission system 10 according to the third configuration example may be similar to each configuration of the transmission system 10 according to the first configuration example. However, in the third configuration example, the transmitting apparatus 20 further includes a second delta-sigma modulator 1010, a second code modulator 1020, a multiplexer 1030, and a controller 1040, and the receiving apparatus 40 further includes a separator 1050, a second demodulator 1060, and a second digital-to-analog converter 1070. The transmission system 10 according to the third configuration example transmits an input signal by using a plurality of channels. Hereinafter, the description of the configuration similar to the transmission system 10 according to the first configuration example is omitted.

The second delta-sigma modulator 1010 in the transmission system 10 of the third configuration example is connected to the second code modulator 1020. The second delta-sigma modulator 1010 has similar configuration and function to those of the first delta-sigma modulator 100 of the first configuration example, and delta-sigma modulates an input signal input into its input terminal separately from the first delta-sigma modulator 100 and outputs second multi-bit delta-sigma modulated signals D2[*n:*0]. Herein, the input signal input into the second delta-sigma modulator 1010 may be the same as or may differ from the input signal input into the first delta-sigma modulator 100.

The second code modulator 1020 according to the third configuration example is connected to the multiplexer 1030. Based on the low-order bit signal of one of the first multi-bit delta-sigma modulated signals and the second multi-bit delta-sigma modulated signals, the second code modulator 1020 code-modulates high-order bit signals D2[*n:m*] (fourth signals) of the second multi-bit delta-sigma modulated signals in a similar manner as in the first code modulator 700 of the first configuration example. As illustrated in FIG. 10, for example, the second code modulator 1020 performs code modulation by performing exclusive OR operations on each of the high-order bit signals D2[*n:m*] of the second delta-sigma modulated signals input from the second delta-sigma modulator 1010 by using the least significant bit signal D1[0] of the first delta-sigma modulated signals input from the first delta-sigma modulator 100 and outputs a code-modulated high-order bit signals D2M[n:m] of the second delta-sigma modulated signals.

The controller 1040 is connected to the multiplexer 1030 and the driving unit 120, and outputs a control signal E for controlling the timing of time-division multiplexing.

The multiplexer 1030 time-division multiplexes code-modulated high-order bit signals D1M[n:m] of the first multi-bit delta-sigma modulated signals and a low-order bit signal D1[*m*−1:0] of the first multi-bit delta-sigma modulated signals and outputs the result to the transmission path 30 via the driving unit 120. The multiplexer 1030 further time-division multiplexes high-order bit signals D2M[n:m] of the second multi-bit delta-sigma modulated signals and a low-order bit signal D2[*m*−1:0] of the second multi-bit delta-sigma modulated signals and outputs the result to the transmission path 30 via the driving unit 120. The multiplexer 1030 according to the present embodiment may time-division multiplex the first multi-bit delta-sigma modulated signals and the second multi-bit delta-sigma modulated signals into one signal for its transmission via one transmission path 30. The multiplexer 1030 may time-division multiplex the multi-bit delta-sigma modulated signals in accordance with the control signal E from the controller 1040. The multiplexer 1030 according to the present embodiment may include first multiplexer and second multiplexer of the present application.

The driving unit 120 receives the time-division multiplexed signals from the multiplexer 1030 and outputs signals DO[n:0] to the one transmission path 30. The driving unit 120 may output the control signal EO to the transmission path 30.

The transmission path 30 is connected in between the driving unit 120 and the separator 1050, and transmits the signals DO[n:0] obtained by time-division multiplexing the lower-order bit signal D1[*m*−1:0], the code-modulated high-order bit signals D1M[n:m] of the first multi-bit delta-sigma modulated signals, the lower-order bit signal D2[*m*−1:0], and the code-modulated high-order bit signals D2M[n:m] of the second multi-bit delta-sigma modulated signals. The transmission path 30 may also transmit the control signal EO.

The separator 1050 is connected to the first demodulator 130 and the second demodulator 1060. The separator 1050 separates the time-division multiplexed signals DO[n:0] into the high-order bit signals D1O[n:m] of the first multi-bit delta-sigma modulated signals and the lower-order bit signal D1O[m−1:0] of the first multi-bit delta-sigma modulated signals. Furthermore, the separator 1050 separates the time-division multiplexed signals into the high-order bit signals D2O[n:m] of the second multi-bit delta-sigma modulated signals and the low-order bit signal D2O[m−1:0] of the second multi-bit delta-sigma modulated signals. The separator 1050 may separate the time-division multiplexed signals DO[n:0] into a signal of all of the bits of the first multi-bit delta-sigma modulated signals and a signal of all of the bits of the second multi-bit delta-sigma modulated signals and output these bits to the first demodulator 130 or the second demodulator 1060. The separator 1050 according to the present embodiment includes first separator and second separator of the present application.

The second demodulator 1060 is connected to the second digital-to-analog converter 1070. Based on the low-order bit signal of one of the first multi-bit delta-sigma modulated signals and the second multi-bit delta-sigma modulated signals transmitted by the transmission path 30, the second demodulator 1060 demodulates the high-order bit signals D2O[n:m] of the second multi-bit delta-sigma modulated signals transmitted via the transmission path 30. The second demodulator 1060 may perform demodulation by performing an exclusive OR operation on the high-order bit signals D2O[n:m] of the second multi-bit delta-sigma modulated signals by using the signal D1[0] (for example, the least significant bit signal D1[0] of the first multi-bit delta-sigma modulated signals) used for code modulation and output the demodulated high-order bit signals D2I[n:m] of the second delta-sigma modulated signals. The second demodulator 1060 may have similar configuration and function to those of the first demodulator 130.

The second digital-to-analog converter 1070 converts from digital to analog the demodulated second multi-bit delta-sigma modulated signals D2I[n:m] and the second multi-bit delta-sigma modulated signals D2O[m−1:0] and outputs an analog signal AOUT2.

Figure 11:
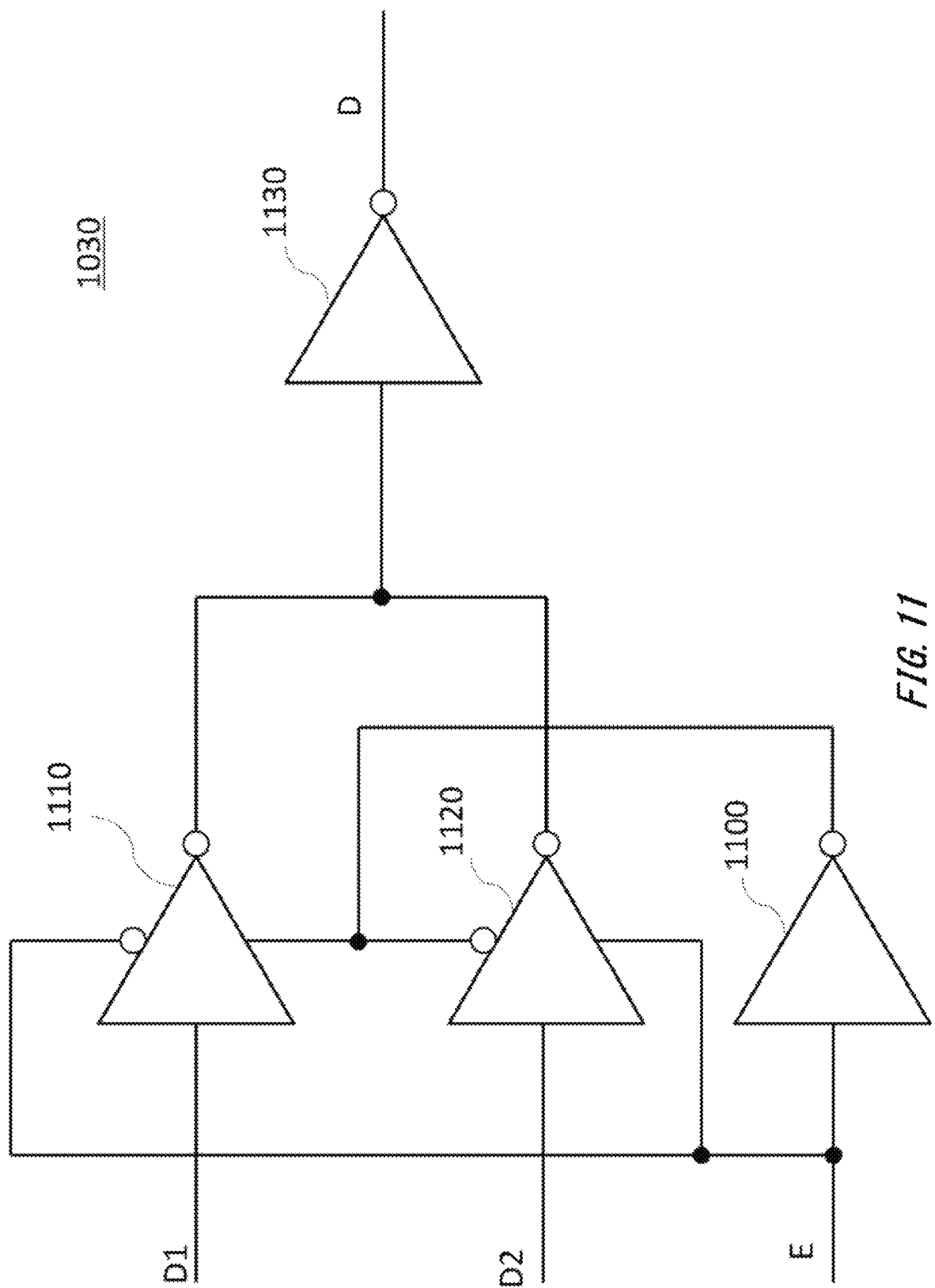
FIG. 11 illustrates a configuration of a multiplexer 1030 of the present embodiment.

FIG. 11 illustrates a configuration of the multiplexer 1030 of the present embodiment. The multiplexer 1030 includes a plurality of inverting buffers 1110, 1120, and 1130.

An inverting buffer 1100 receives an input of the control signal E from the controller 1040, inverts the signal, and outputs the control signal E. The inverting buffer 1110 receives an input of the first multi-bit delta-sigma modulated signals D1 (D1M[n:m] and D1[m−1:0]), inverts the signals, and outputs the first multi-bit delta-sigma modulated signals D1 in accordance with the value of the control signal E of the other input. Because the inverting buffer 1110 receives an input of the inverted control signal E from the inverting buffer 1100, the inverting buffer 1110 inverts and outputs the first multi-bit delta-sigma modulated signals D1 in the case of inputting the control signal E=0 into the multiplexer 1030 (inverting buffer 1100) and does not perform the output in the case of inputting the control signal E=1. The inverting buffer 1120 receives an input of the second multi-bit delta-sigma modulated signals D2 (D2M[n:m] and D2[m−1:0]), and inverts and outputs the second multi-bit delta-sigma modulated signals D2 in accordance with the value of the control signal E at the other input. Because the control signal E from the inverting buffer 1100 is input into the inverting buffer 1120 without change, the inverting buffer 1120 inverts and outputs the second multi-bit delta-sigma modulated signals D2 in the case of the control signal E=1 input into the multiplexer 1030 (inverting buffer 1100) and does not perform the output in the case of the control signal E=0.

The inverting buffer 1130 receives an input of the output signal from the inverting buffer 1110 and 1120, inverts the received signal, and outputs a signal D. As a result, the multiplexer 1030 selectively outputs the first multi-bit delta-sigma modulated signals D1 and the second multi-bit delta-sigma modulated signals D2 in accordance with the control signal E.

Figure 12:
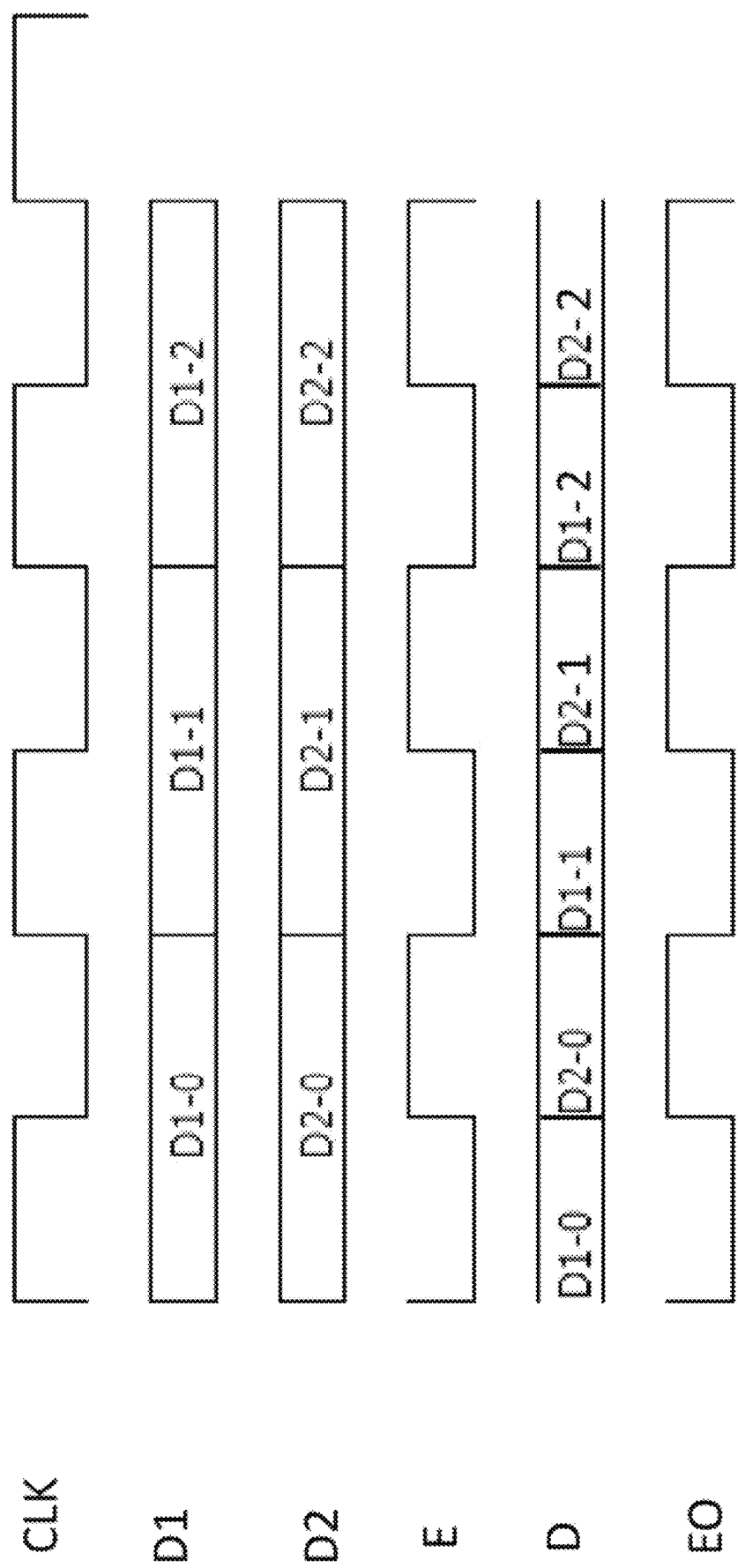
FIG. 12 illustrates a timing chart of the multiplexer 1030 of the present embodiment.

FIG. 12 illustrates a timing chart of the multiplexer 1030 of the present embodiment. In FIG. 12, CLK indicates a clock signal input into the first and second delta-sigma modulator 100 and 1010, D1 indicates the first multi-bit delta-sigma modulated signals of bits 0 to n, D2 indicates the second multi-bit delta-sigma modulated signals of bits 0 to n, E indicates a control signal output from the controller 1040, D indicates a signal time-division multiplexed by the multiplexer 1030, and EO indicates a control signal (digital clock signal) transmitted via the transmission path 30. The multiplexer 1030 time-division multiplexes the signal D1 and the signal D2 received in one period of the clock signal (CLK) while switching the output every ½ period of the control signal E, and outputs the signal D. The signal D for one period of the clock signal includes the signal D1 for the one period and the signal D2 for the one period.

Figure 13:
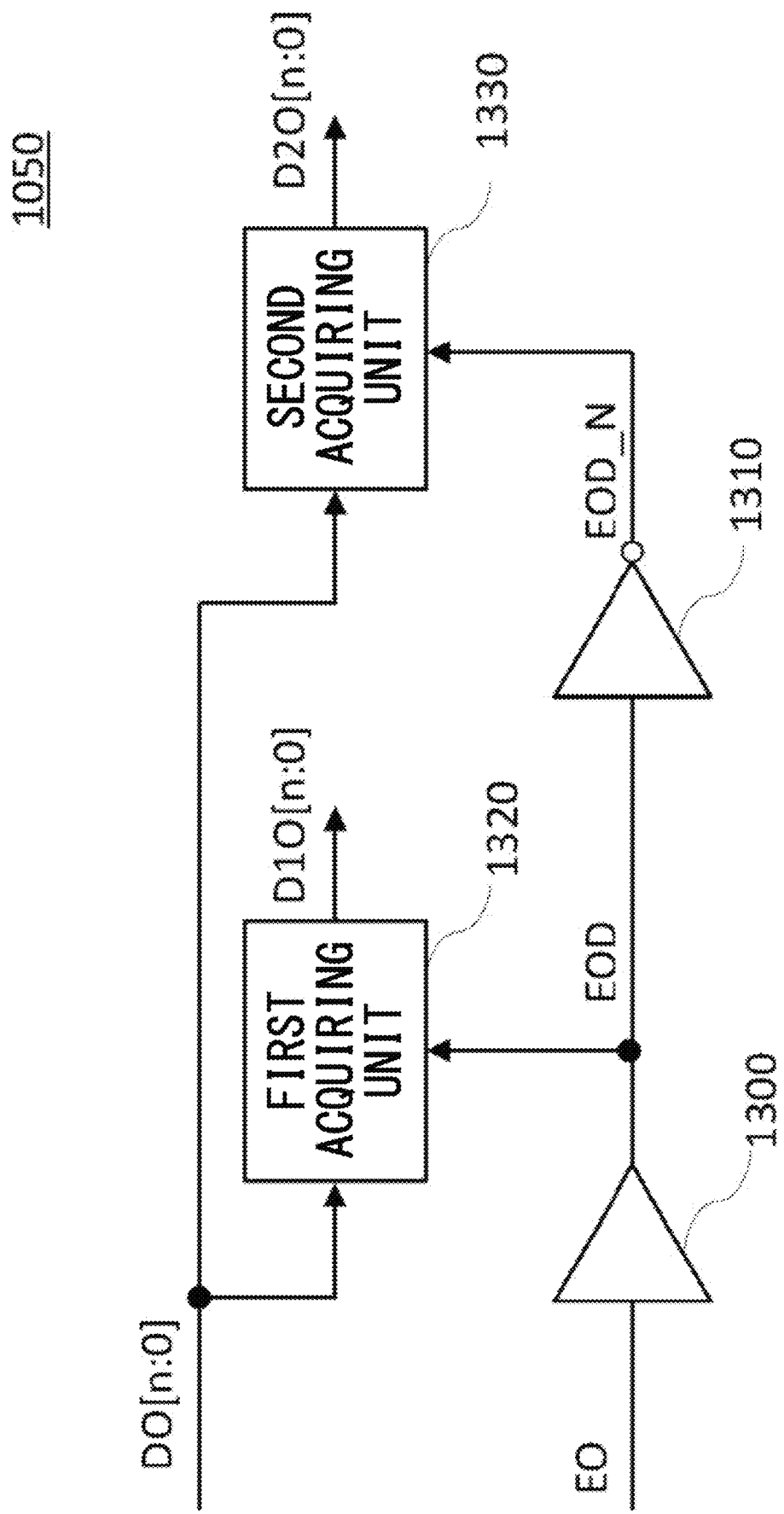
FIG. 13 illustrates a configuration of a separator 1050 of the present embodiment.

FIG. 13 illustrates a configuration of the separator 1050 of the present embodiment. The separator 1050 includes a buffer 1300, an inverting buffer 1310, a first acquiring unit 1320, and a second acquiring unit 1330.

The output of the buffer 1300 is connected to the input of the inverting buffer 1310 and the first acquiring unit 1320, and the buffer 1300 outputs a signal EOD obtained by buffering the control signal EO received via the transmission path 30. The output of the inverting buffer 1310 is connected to the second acquiring unit 1330, and the inverting buffer 1310 outputs a signal EOD_N obtained by inverting the input control signal EOD. Accordingly, the control signal EOD is input into the first acquiring unit 1320 and the control signal EOD_N is input into the second acquiring unit 1330.

The first acquiring unit 1320, a flip-flop as an example, is connected to the transmission path 30, the first demodulator 130, and the first digital-to-analog converter 140. In accordance with the rise of the control signal EO input into the separator 1050 (for example, when control signal EOD=1), the first acquiring unit 1320 acquires the signal DO[n:0] from the transmission path 30 and outputs the first multi-bit delta-sigma modulated signals D1O[n:0] to the first demodulator 130 and the first digital-to-analog converter 140.

The second acquiring unit 1330 is connected to the transmission path 30, the second demodulator 1060, and the second digital-to-analog converter 1070, and is flip-flops as an example. In accordance with the fall of the control signal EO input into the separator 1050 (for example, when the input control signal EOD_N=1), the second acquiring unit 1330 acquires the signals DO[n:0] from the transmission path 30 and outputs the second multi-bit delta-sigma modulated signals D2O[n:0] to the second demodulator 1060 and the second digital-to-analog converter 1070.

Figure 14:
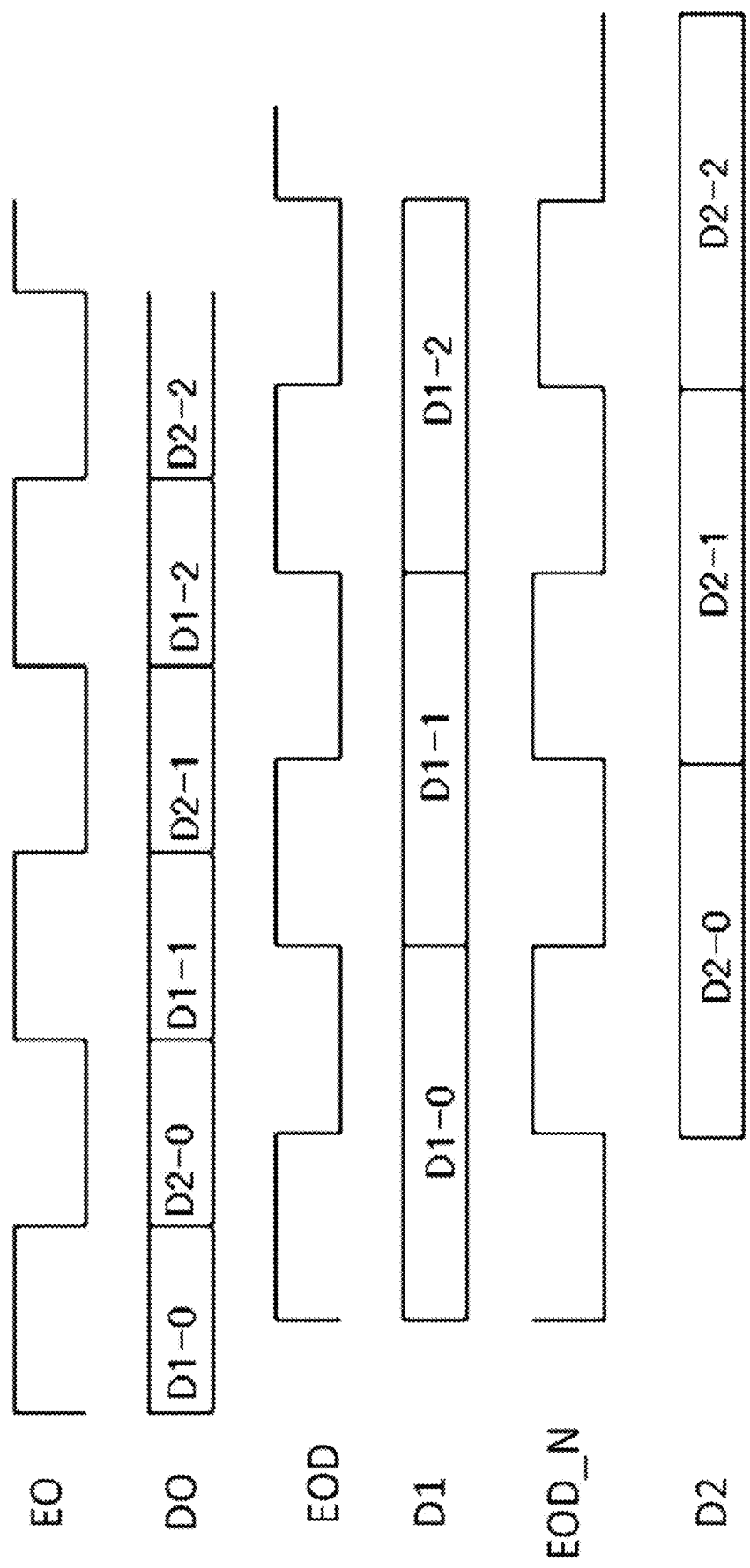
FIG. 14 illustrates a timing chart of the separator 1050 of the present embodiment.

FIG. 14 illustrates a timing chart of the separator 1050 of the present embodiment. In FIG. 14, EO indicates a control signal transmitted via the transmission path 30, DO indicates a time-division multiplexed signal transmitted via the transmission path 30, EOD indicates a control signal delayed in the separator 1050, D1 indicates the first multi-bit delta-sigma modulated signals of bits 0 to n separated by the separator 1050, and D2 indicates the second multi-bit delta-sigma modulated signals of bits 0 to n separated by the separator 1050.

The buffer 1300 outputs the delayed control signal EOD from the control signal EO. When the control signal EOD at the one input rises up to 1, the first acquiring unit 1320 acquires and outputs the first multi-bit delta-sigma modulated signals D1 from the other input. The first acquiring unit 1320 maintains the output value until the rise of the following control signal EOD, and when the following control signal EOD rises up, acquires and outputs the first multi-bit delta-sigma modulated signals D1 from the other input.

When the control signal EOD falls down to 0, the second acquiring unit 1330 acquires and outputs the second multi-bit delta-sigma modulated signals D2 from the input. The second acquiring unit 1330 maintains the value of the output up to the fall of the next control signal EOD, and when the next control signal EOD falls down, acquires and outputs the second multi-bit delta-sigma modulated signals D2 from the input.

The transmission system 10 according to the third configuration example of the present embodiment time-division multiplexes and transmits multi-bit delta-sigma modulated signals generated by a plurality of channels, separates the signals at the receiving side, and outputs analog signals of the plurality of channels. In this case, because code modulation is performed by using the low-order bit signal of the multi-bit delta-sigma modulated signals to be transmitted, noise caused by signal transmission can be reduced without increasing a circuit scale for pseudo-random signals.

Moreover, the transmission system 10 of the first or second configuration example may time-division multiplex and transmit the first multi-bit delta-sigma modulated signals D1 by using the multiplexer 1030 and separate the signals into signals of the respective bits by using the separator 1050 at the receiving side. Furthermore, the multiplexer 1030 according to the third configuration example may include two different multiplexers (first multiplexer and second multiplexer). In this case, one of the two multiplexers may time-division multiplex the first multi-bit delta-sigma modulated signals and output the result to the one transmission path 30, and the other may time-division multiplex the second multi-bit delta-sigma modulated signals and output the result to the other transmission path 30. In this case, the separator 1050 may include two different separators (first separator and second separator) corresponding to the two multiplexers. Herein, the two multiplexers may have similar configuration and function to those of the multiplexer 1030, and the two separators may have similar configuration and function to those of the separator 1050.

The low-order bit signal used for code modulation is not limited to the signal of the least significant bit 0 and/or the bit 1 of the multi-bit delta-sigma modulated signals. Therefore, the low-order bit signal may be a signal of one or more of the low-order bit signals in the order lower than the order of the high-order bits of the multi-bit delta-sigma modulated signals directed for code modulation. For example, as a modified example of the third configuration example of the transmission system 10 of the present embodiment as illustrated in FIG. 10, by using at least part of the lower-order bit signal $D2[m-1:0]$ (third signal) of the second multi-bit delta-sigma modulated signals, the transmission system 10 may code-modulate the high-order bit signals $D2[n:m]$ of the second multi-bit delta-sigma modulated signals by using at least part of the low-order bit signal $D2[m-1:0]$ (third signal) of the second multi-bit delta-sigma modulated signals and demodulate the code-modulated signal.

The various embodiments of the present disclosure may be described with reference to a flowchart and a block diagram. Herein, blocks may represent (1) steps in the process where operations are performed or (2) sections of the apparatus responsible for performing operations. Specific steps and sections may be implemented by a dedicated circuit, a programmable circuit provided with computer-readable instructions stored on a computer-readable medium, and/or a processor provided with computer-readable instructions stored on a computer-readable medium. The dedicated circuit may include a digital and/or analog hardware circuit or include an integrated circuit (IC) and/or a discrete circuit. The programmable circuit may include a reconfigurable hardware circuit including a logical AND, a logical OR, a logical XOR, a logical NAND, a logical NOR, or other logical operations, and memory elements such as flip-flops, a register, a field programmable gate array (FPGA), a programmable logic array (PLA), or the like.

The computer-readable medium may include any tangible device that can store instructions to be executed by an appropriate device. As a result, the computer-readable medium having instructions stored thereon includes a manufactured product that includes instructions that can be executed to create means for executing operations designated in a flowchart or a block diagram. As an example, the computer-readable medium may include an electronic storage medium, a magnetic storage medium, an optical storage medium, an electromagnetic storage medium, a semiconductor storage medium, and the like. As a more specific example, the computer-readable medium may include a floppy (registered trademark) disk, a diskette, a hard disk, a random access memory (RAM), a read-only memory (ROM), an erasable programmable read-only memory (EPROM or flash memory), an electrically erasable programmable read-only memory (EEPROM), a static random access memory (SRAM), a compact disc read-only memory (CD-ROM), a digital versatile disc (DVD), a Blu-ray (registered trademark) disc, a memory stick, an integrated circuit card, and the like.

The computer-readable instructions may include either source codes or object codes written in any combination of one or more programming languages that include assembler instructions, instruction set architecture (ISA) instructions, machine instructions, machine-dependent instructions, microcodes, firmware instructions, state setting data, an object-oriented programming language such as Smalltalk, JAVA (registered trademark), C++, or the like, and a conventional procedural programming language such as Python, a "C" programming language, or a similar programming language.

The computer-readable instructions may be provided to a processor or a programmable circuit of a general-purpose computer, a special-purpose computer, or another programmable data processing device locally or via a local area network (LAN) or a wide area network (WAN) such as the Internet so as to be executed to create means for executing the operations designated in a flowchart or a block diagram. As an example, the processor includes a computer processor, a processing unit, a microprocessor, a digital signal processor, a controller, a microcontroller, or the like.

Figure 15:
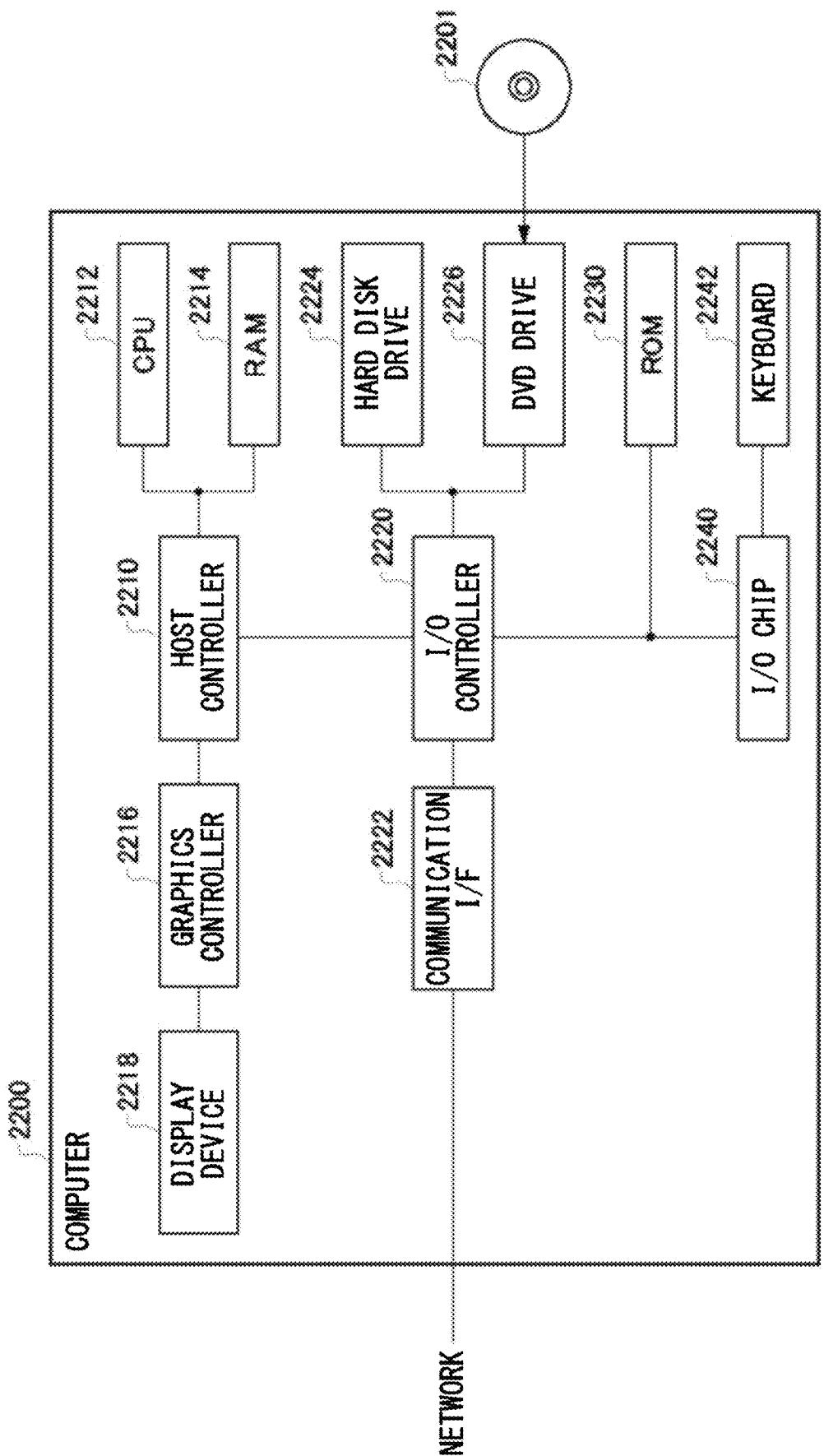
FIG. 15 illustrates an example of a computer 2200 in which a plurality of aspects of the present embodiment can be embodied wholly or partially.

FIG. 15 illustrates an example of a computer 2200 in which the plurality of aspects of the present disclosure may be wholly or partially embodied. A program installed in the computer 2200 can cause the computer 2200 to function as operations associated with the apparatus or one or more sections of the apparatus according to the embodiment of the present disclosure or to execute the operations or the one or more sections, and/or the computer 2200 to execute a process or the steps of the process according to the embodiment of the present disclosure. Such a program may be executed by a CPU 2212 and/or a graphics controller 2216 such as GPU in order to cause the computer 2200 to execute specific operations associated with some or all of the blocks in the flowcharts and the block diagrams described in the present specification.

The computer 2200 according to the present embodiment includes the CPU 2212, a RAM 2214, the graphics controller 2216, and a display device 2218, which are interconnected by a host controller 2210. The computer 2200 further includes a communication interface 2222, a hard disk drive 2224, a DVD-ROM drive 2226, and an input/output unit such as an IC card drive, which are connected to the host controller 2210 via an input/output controller 2220. The computer further includes a legacy input/output unit such as a ROM 2230 and a keyboard 2242, which are connected to the input/output controller 2220 via an input/output chip 2240.

The CPU 2212 operates in accordance with the program stored in the ROM 2230 and the RAM 2214 and thus controls each unit. The graphics controller 2216 acquires and loads image data generated by the CPU 2212 in a frame buffer or the like provided in the RAM 2214 or in itself and causes the display device 2218 to display thereon the image data.

The communication interface 2222 communicates with other electronic devices via the network. The hard disk drive 2224 stores therein a program and data to be used by the CPU 2212 in the computer 2200. The DVD-ROM drive 2226 reads a program or data from a DVD-ROM 2201 and provides the program or data to the hard disk drive 2224 via the RAM 2214. The IC card drive reads a program and data from an IC card and/or writes a program and data to the IC card.

The ROM 2230 stores therein a boot program etc. executed by the computer 2200 when the computer becomes activated and/or a program that is dependent on the hardware of the computer 2200. The input/output chip 2240 may connect various input/output units to the input/output controller 2220 via a parallel port, a serial port, a keyboard port, a mouse port, or the like.

The programs are provided by a computer-readable medium such as the DVD-ROM 2201 or the IC card. The programs are read from the computer-readable medium, are installed in the hard disk drive 2224, the RAM 2214, or the ROM 2230 that is an example of the computer-readable medium, and are executed by the CPU 2212. The information processing described in these programs is read by the computer 2200 and provides a link between the programs and the various types of hardware resources described above. The apparatus or method may be configured by realizing the operations or processing of information according to the use of the computer 2200.

For example, when communication is executed between the computer 2200 and an external device, the CPU 2212 may execute a communication program loaded onto the RAM 2214 and instruct the communication interface 2222 to perform communication processing based on the processing described in the communication program. Under the control of the CPU 2212, the communication interface 2222 reads transmission data stored in a transmit buffer processing area provided in a recording medium such as the RAM 2214, the hard disk drive 2224, the DVD-ROM 2201, or the IC card, and then transmits the read transmission data to the network or writes reception data received from the network in a receive buffer processing area etc. provided in the recording medium.

Moreover, the CPU 2212 may cause the RAM 2214 to read all or necessary parts of a file or database stored in an external recording medium such as the hard disk drive 2224, the DVD-ROM drive 2226 (DVD-ROM 2201), or the IC card, and may execute various types of processing on the data in the RAM 2214. Next, the CPU 2212 writes the processed data back to the external recording medium.

Various types of information such as various types of programs, data, tables, and databases may be stored in the recording medium to be subjected to information processing. The CPU 2212 may execute various types of operations and various types of processing, which are described throughout the present specification and are specified by the instruction sequences of the program, on the data read from the RAM 2214. Herein, the various types of processing include information processing, conditional judgement, conditional branch, unconditional branch, information retrieval/substitution, and the like. Then, the CPU writes the results back to the RAM 2214. Moreover, the CPU 2212 may retrieve information from files, databases, etc. in the recording medium. For example, when a plurality of entries each having the attribute value of a first attribute associated with the attribute value of a second attribute is stored in the recording medium, the CPU 2212 may retrieve an entry that matches a condition specified by the attribute value of the first attribute from among the plurality of entries, read the attribute value of the second attribute stored in this entry, and thus acquire the attribute value of the second attribute associated with the first attribute that satisfies the predetermined condition.

The program or software module described above may be stored in the computer 2200 or on the computer-readable medium near the computer 2200. Moreover, a recording medium such as a hard disk or RAM provided in a server system connected to a dedicated communication network or the Internet, for example a cloud server can be used as a computer-readable medium, and thus a program is provided to the computer 2200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A transmission system comprising:
a transmitting apparatus including a first delta-sigma modulator that outputs first multi-bit delta-sigma modulated signals of three or more bits and a first code modulator that code-modulates first signals of two or more bits located in bit positions higher than a predetermined bit position of the first multi-bit delta-sigma modulated signals based on at least part of a second signal located in one or more bit positions not higher than the predetermined bit position and outputs a plurality of modulated signals;
a transmission path that transmits the second signal and the plurality of modulated signals; and
a receiving apparatus including a first demodulator that demodulates the plurality of modulated signals received from the transmission path based on at least part of the second signal received from the transmission path.

2. The transmission system according to claim 1, wherein the second signal is a signal of a least significant bit of the first multi-bit delta-sigma modulated signals.

3. The transmission system according to claim 1, wherein the second signal has a lower correlation with the first multi-bit delta-sigma modulated signals than the first signals.

4. The transmission system according to claim 1, wherein the transmitting apparatus further comprises
a first multiplexer that time-division multiplexes the second signal and the plurality of modulated signals and outputs a time-division multiplexed signal to the transmission path.

5. The transmission system according to claim 4, wherein the receiving apparatus further comprises
a first separator that separates the time-division multiplexed signal into the second signal and the plurality of modulated signals.

6. The transmission system according to claim 1, wherein the transmitting apparatus further comprises
a second delta-sigma modulator that outputs second multi-bit delta-sigma modulated signals of three or more bits; and
a second code modulator that code-modulates fourth signals of two or more bits located in bit positions higher than the predetermined bit position of the second multi-bit delta-sigma modulated signals based on at least part of the second signal and a third signal located in one or more bit positions not higher than the predetermined bit position of the second multi-bit delta-sigma modulated signals and outputs a plurality of second modulated signals,
the transmission path transmits the third signal, and the plurality of second modulated signals, and
the receiving apparatus comprises a second demodulator that demodulates the fourth signals received from the transmission path based on the at least part of the second signal and the third signal received from the transmission path.

7. The transmission system according to claim 6, wherein the transmitting apparatus further comprises
a second multiplexer that time-division multiplexes the third signal and the plurality of second modulated signals and outputs a time-division multiplexed signal to the transmission path.

8. The transmission system according to claim 7, wherein the receiving apparatus further comprises
a second separator that separates the time-division multiplexed signal into the third signal and the plurality of second modulated signals.

9. A transmitting apparatus comprising:
a first delta-sigma modulator that outputs first multi-bit delta-sigma modulated signals of three or more bits; and
a first code modulator that code-modulates first signals of two or more bits located in bit positions higher than a predetermined bit position of the first multi-bit delta-sigma modulated signals based on at least part of a second signal located in one or more bit positions not higher than the predetermined bit position and outputs a plurality of modulated signals, wherein
the transmitting apparatus transmits the second signal and the plurality of modulated signals to a transmission path.

10. The transmitting apparatus according to claim 9, wherein the second signal is a signal of a least significant bit of the first multi-bit delta-sigma modulated signals.

11. The transmitting apparatus according to claim 9, further comprising a first multiplexer that time-division multiplexes the plurality of modulated signals and the second signal.

12. The transmitting apparatus according to claim 9, further comprising:
a second delta-sigma modulator that outputs second multi-bit delta-sigma modulated signals of three or more bits; and
a second code modulator that code-modulates fourth signals of two or more bits located in bit positions higher than the predetermined bit position of the second multi-bit delta-sigma modulated signals based on at least part of the second signal and a third signal located in one or more bit positions not higher than the predetermined bit position of the second multi-bit delta-sigma modulated signals and outputs a plurality of second modulated signals, wherein
the transmitting apparatus transmits the third signal and the plurality of second modulated signals to the transmission path.

13. The transmitting apparatus according to claim 12, further comprising a second multiplexer that time-division multiplexes the third signal and the plurality of second modulated signals.

14. A non-transitory computer-readable storage medium for storing therein a program to make a computer function as the transmitting apparatus according to claim 9.

15. A receiving apparatus receiving first multi-bit delta-sigma modulated signals of three or more bits, the receiving apparatus comprising:
a first demodulator that demodulates a plurality of code-modulated signals of two or more bits located in bit positions higher than a predetermined bit position of the first multi-bit delta-sigma modulated signals based on at least part of a second signal located in one or more bit positions not higher than the predetermined bit position of the received first multi-bit delta-sigma modulated signals.

16. The receiving apparatus according to claim 15, wherein the second signal is a signal of a least significant bit of the first multi-bit delta-sigma modulated signals.

17. The receiving apparatus according to claim 15, further comprising a first separator that separates a signal transmitted by time-division multiplexing the plurality of modulated signals and the second signal into the plurality of modulated signals and the second signal.

18. The receiving apparatus according to claim 15, wherein
  the receiving apparatus receives second multi-bit delta-sigma modulated signals of three or more bits that is multi-bit delta-sigma modulated separately from the first multi-bit delta-sigma modulated signals, and
  the receiving apparatus comprises a second demodulator that demodulates a plurality of second modulated signals obtained by code-modulating fourth signals of two or more bits located in bit positions higher than the predetermined bit position of the second multi-bit delta-sigma modulated signals based on at least part of the second signal and a third signal located in one or more bit positions not higher than the predetermined bit position of the second multi-bit delta-sigma modulated signals.

19. The receiving apparatus according to claim 18, further comprising a second separator that separates a signal transmitted by time-division multiplexing the plurality of second modulated signals and the third signal into the plurality of second modulated signals and the third signal.

20. A non-transitory computer-readable storage medium for storing therein a program to make a computer function as the receiving apparatus according to claim 15.

* * * * *